US007264992B2

(12) United States Patent
Hsueh et al.

(10) Patent No.: US 7,264,992 B2
(45) Date of Patent: Sep. 4, 2007

(54) REMOVABLE FLASH INTEGRATED MEMORY MODULE CARD AND METHOD OF MANUFACTURE

(76) Inventors: Paul Hsueh, 4790 Myrtle Dr., Concord, CA (US) 94521; Jim Ni, 391 Hans Way, San Jose, CA (US) 95133; Sun-Teck See, 3262 Pinkerton Dr., San Jose, CA (US) 95148; Kuang-Yu Wang, 19772 Viewridge Dr., Saratoga, CA (US) 95070

( * ) Notice: Subject to any disclaimer, the term of this patent is extended or adjusted under 35 U.S.C. 154(b) by 179 days.

(21) Appl. No.: 10/913,868

(22) Filed: Aug. 6, 2004

(65) Prior Publication Data

US 2006/0030080 A1 Feb. 9, 2006

(51) Int. Cl.
*H01L 21/50* (2006.01)
*H01L 21/48* (2006.01)
*H01L 21/44* (2006.01)
*H01L 23/02* (2006.01)
*H01L 23/498* (2006.01)

(52) U.S. Cl. ............... 438/106; 438/125; 438/126; 257/679; 257/E23.064

(58) Field of Classification Search ............... 438/106, 438/125–126; 257/679–680, E23.064
See application file for complete search history.

(56) References Cited

U.S. PATENT DOCUMENTS

| 6,444,501 | B1 * | 9/2002 | Bolken | 438/127 |
|---|---|---|---|---|
| 6,462,273 | B1 * | 10/2002 | Corisis et al. | 174/521 |
| 6,570,825 | B2 * | 5/2003 | Miranda et al. | 361/728 |
| 6,580,615 | B1 * | 6/2003 | Nakanishi et al. | 361/737 |
| 6,740,964 | B2 * | 5/2004 | Sasaki | 257/687 |
| 6,924,547 | B2 * | 8/2005 | Kanemoto et al. | 257/666 |
| 7,089,661 | B2 * | 8/2006 | Fong et al. | 29/841 |
| 2002/0186549 | A1 * | 12/2002 | Bolken | 361/737 |
| 2004/0066693 | A1 * | 4/2004 | Osako et al. | 365/222 |

* cited by examiner

*Primary Examiner*—Luan Thai
(74) *Attorney, Agent, or Firm*—Larry D. Johnson

(57) ABSTRACT

A removable Flash integrated memory module card has a plastic shell and an integral Flash memory module. On the backside of the card, there are exposed contact pads. When the card is inserted into a card-hosting device, the card can communicate with the device through the exposed pads. The manufacturing method includes manufacturing of the memory module and utilizing plastic molding techniques for making the card outer body. The method involves preparing the substrate, mounting the components, testing the module, preparing the molding device, and molding the card body.

18 Claims, 11 Drawing Sheets

SD -A1 MEMORY CARD
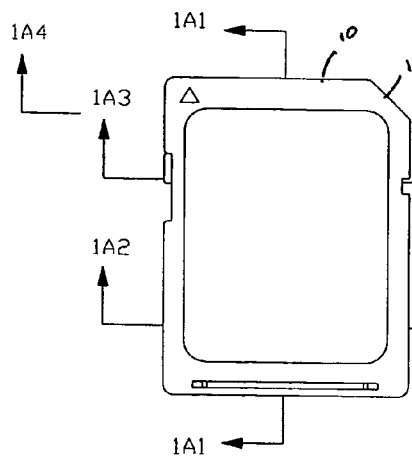
Fig. 1A
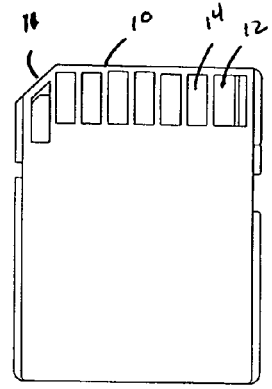
Fig. 1B
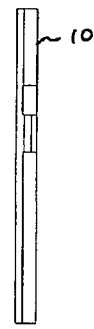
Fig. 1C
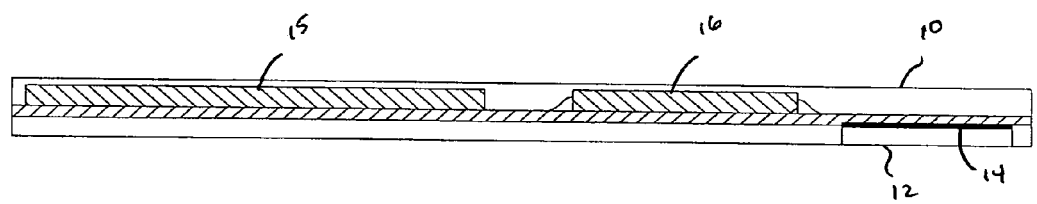
Fig. 1A1
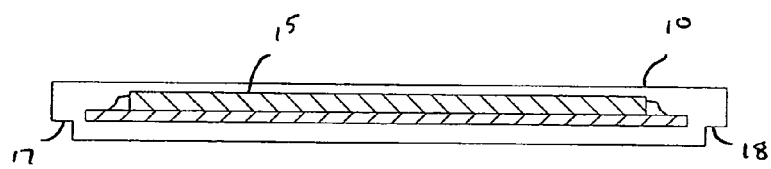
Fig. 1A2
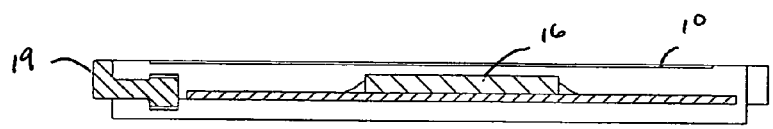
Fig. 1A3
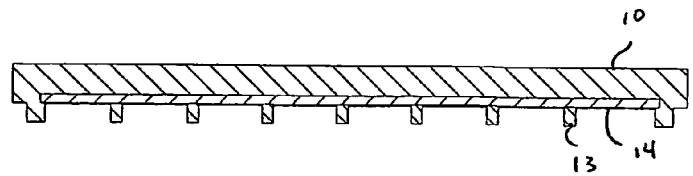
Fig. 1A4

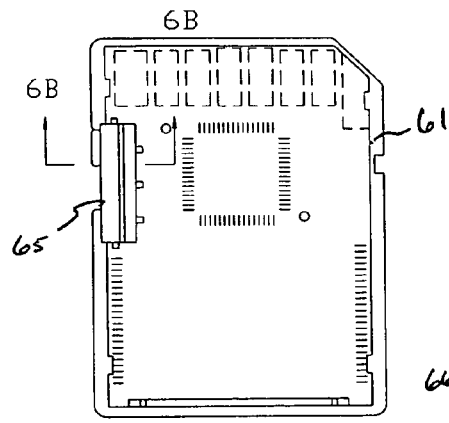
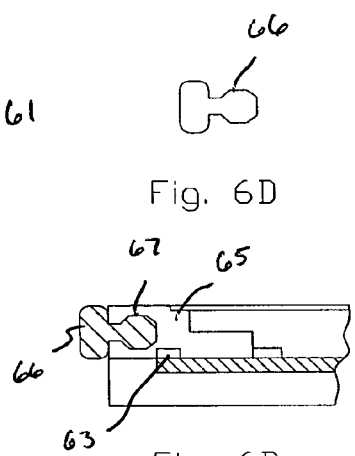
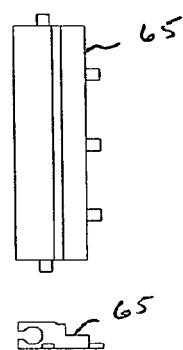
Fig. 6A  Fig. 6B  Fig. 6C
Fig. 6D
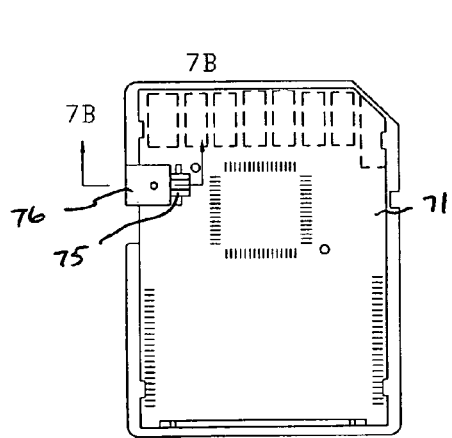
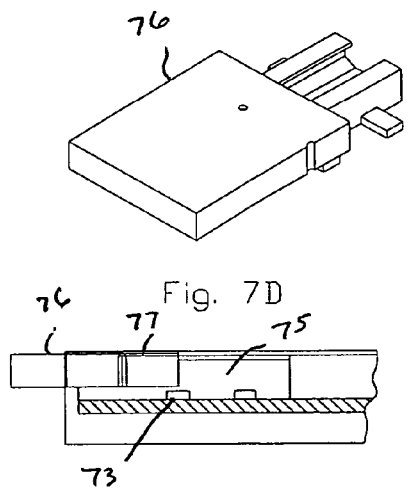
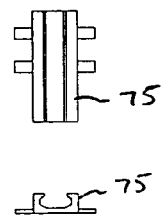
Fig. 7A  Fig. 7B  Fig. 7C
Fig. 7D

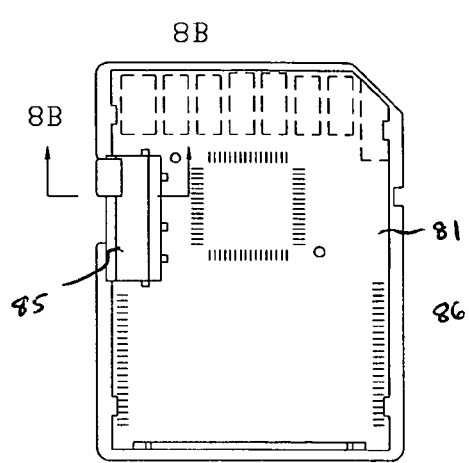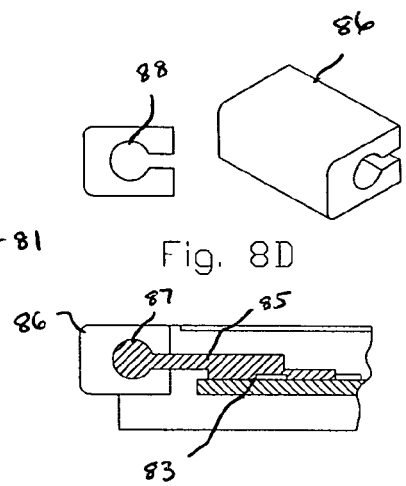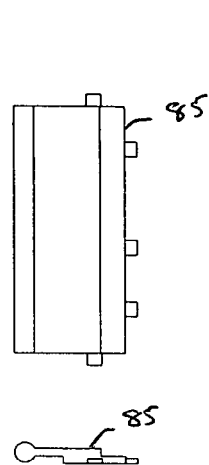
Fig. 8A        Fig. 8B        Fig. 8C
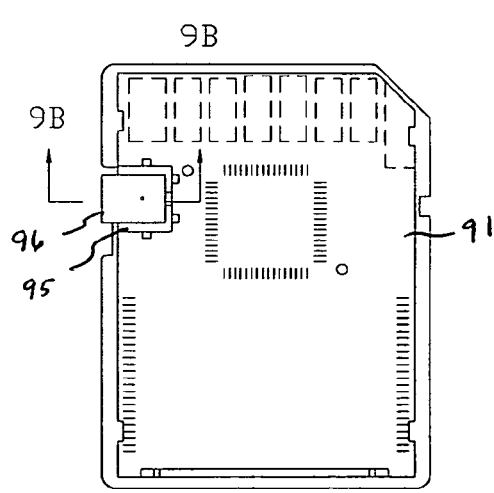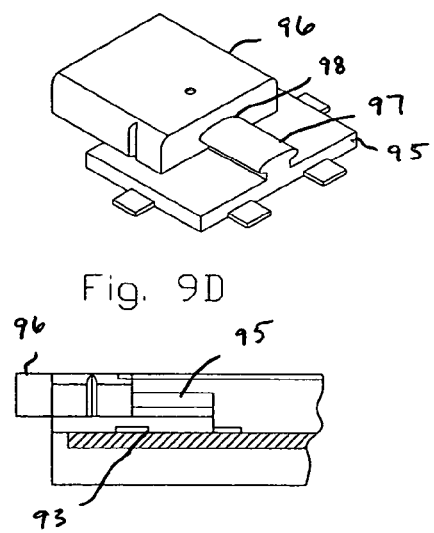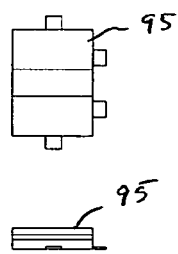
Fig. 9A        Fig. 9B        Fig. 9C

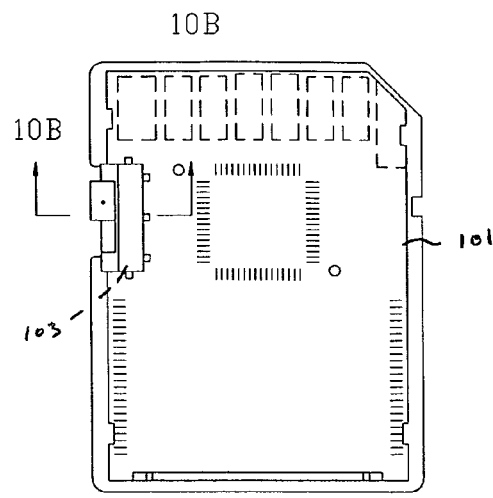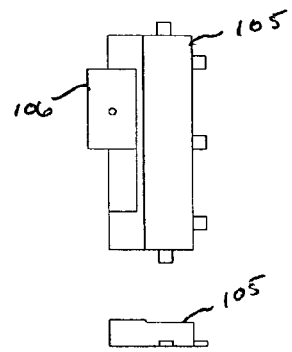
Fig. 10A  Fig. 10B
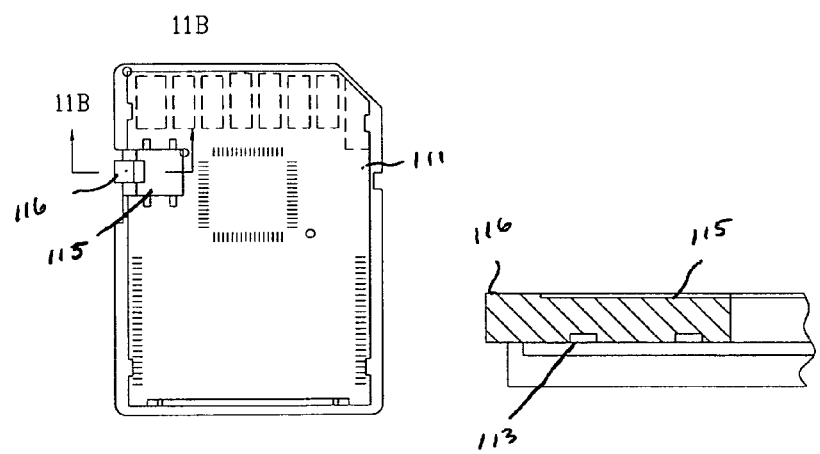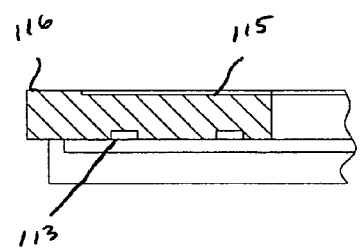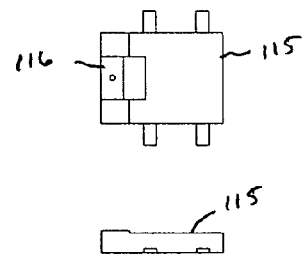
Fig. 11A  Fig. 11B  Fig. 11C

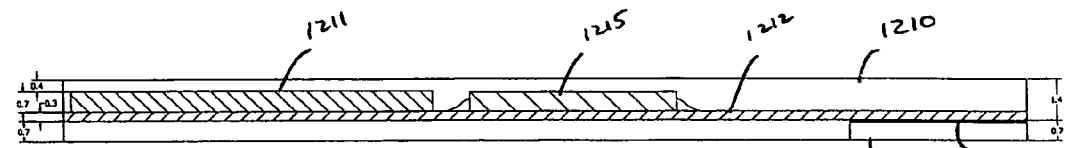
Fig. 12A1
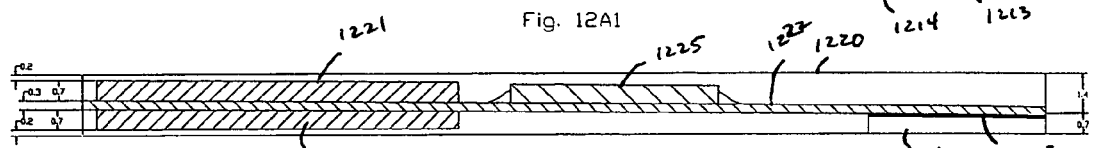
Fig. 12A2
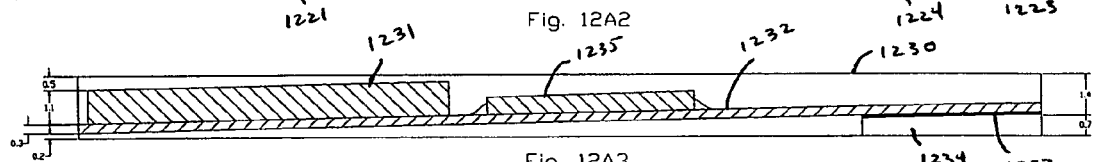
Fig. 12A3
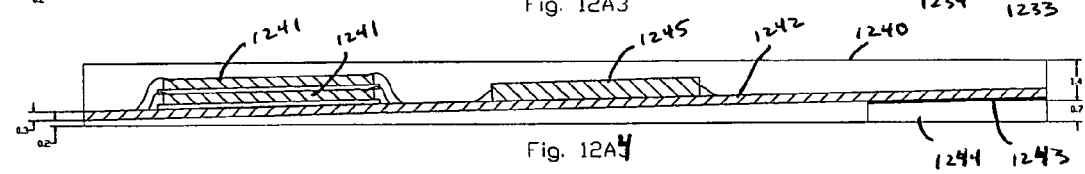
Fig. 12A4
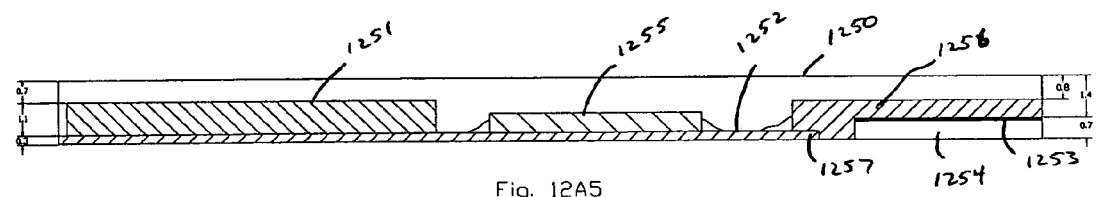
Fig. 12A5
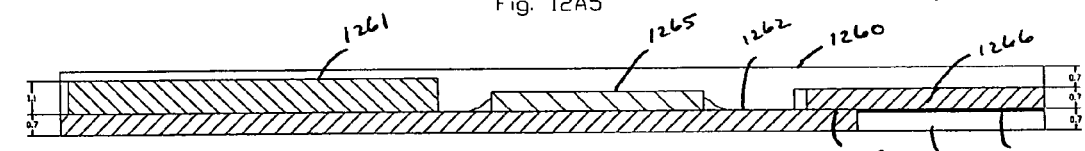
Fig. 12A6
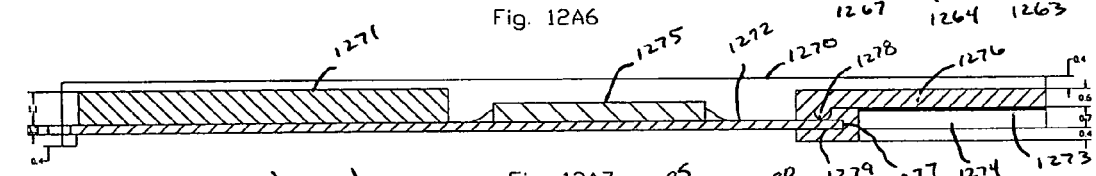
Fig. 12A7
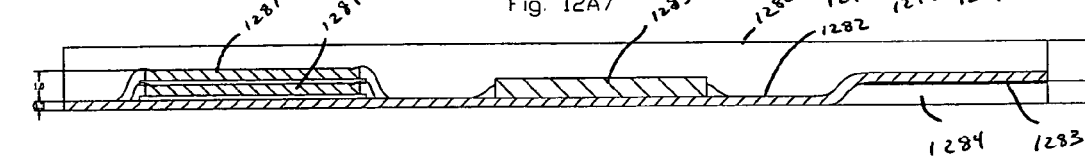
Fig. 12A8

REMOVABLE FLASH INTEGRATED MEMORY MODULE CARD AND METHOD OF MANUFACTURE

CROSS REFERENCE TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

TECHNICAL FIELD

The present invention relates generally to Flash memory modules, more particularly to an improved removable Flash integrated memory module card, and a method for manufacturing such cards.

BACKGROUND INFORMATION AND DISCUSSION OF RELATED ART

One of the conventional structures of an SD card consists of a card shell and a memory module, such as described in U.S. Pat. No. 6,381,143.

U.S. Pat. No. 6,399,906 describes an IC card connector for electronic devices. The connector has a receptacle portion to receive an IC card, and has a built in switch that can detect the card write protection switch setting. The switch has at least two positions; a position for allowing the host to read and write normally and another position for write protection. When the switch is in the write protection position, the host can read data from the card but cannot write or erase data. The switch is a plastic piece that is inserted inside the groove on the side of the card and can slide in the groove. The switch does not make any contact with the electrical circuit on the card.

The card outside shell is typically made from two half shells and is welded together by applying ultrasonic waves to the two halves jointing locations and melting the joints. Typically the shell is made from plastic material, made by an injection molding process with the thickness in each half approximately 0.3 mm.

The shell has an edge protruding away from the shell surface along the outer periphery of the shell. On top of the edge there is pre-arranged intermittent protruding ridge and the shape is triangular in cross-section. These ridges are to be melted during ultrasonic welding.

Assembly typically consists of first inserting the lower cover into the ultrasonic machine lower die, then inserting the module on top of the lower cover, then inserting the switch and then inserting the top cover. Next, the ultrasonic machine upper die is lowered to press the upper cover against the lower cover, with the ridges are resting against the other cover peripheral edge. Next, the ultrasonic wave is turned on. Since the lower cover is being held steady by the lower die and is not moving, and the upper cover is vibrated by the ultrasonic wave, the friction between the covers generates heat to melt the protruding ridges and weld the two covers together.

There are several problems associated with the above-described manufacturing process. For example, since the ridges on the card case are small, even after the ridge is melted, it becomes a thin line of plastic holding the two halves together. The thin welding line has limited strength, and can be pulled apart.

In addition, the card case and module are two separate units, but one unit does not strengthen the other. Therefore, it is not as strong as if the two units were interfused, and is easier to be deformed due to bending or twisting when in use.

A further problem with the ultrasonic welding process is that it is labor intensive. As mentioned above regarding the card assembling process, because of the complex shapes of the covers and modules, the loading of covers, module and switch are usually handled by human hands. Also, the alignment of these parts is critical. During the ultrasonic head lowering process and making contact with the covers, one has to watch the alignment of the parts. So, it can be seen that the assembling process is difficult to be automated and implemented into "on line" production.

Another aspect of ultrasonic welding is that the welding quality has to be assured. The ultrasonic wave power has to be enough to melt the joints evenly around the peripheral edges, but overpowering may damage the electrical components on the module.

The present invention addresses these problems by utilizing plastic molding techniques of injecting plastic material to form the card outer body. As the card body plastic is bonded to the module, the plastic body and module become one unit. Also, the manufacturing process can be more automated.

The referenced patents reflect the current state of the art of which the present inventor is aware. Reference to, and discussion of, these patents is intended to aid in discharging Applicant's acknowledged duty of candor in disclosing information that may be relevant to the examination of claims to the present invention. However, it is respectfully submitted that none of the above-indicated patents disclose, teach, suggest, show, or otherwise render obvious, either singly or when considered in combination, the invention described and claimed herein.

BRIEF SUMMARY OF THE INVENTION

The present invention provides a removable Flash integrated memory module card having a plastic shell and an integral Flash memory module. On the backside of the card, there are exposed contact pads. When the card is inserted into a card-hosting device, the card can communicate with the device through the exposed pads. The manufacturing method includes manufacturing of the memory module and utilizing plastic molding techniques for making the card outer body. The method involves preparing the substrate, mounting the components, testing the module, preparing the molding device, and molding the card body.

It is a first object of the present invention to provide various designs for a Flash integrated memory module card having increased card capacity and functionality.

It is a second object of the present invention to manufacture a card that is physically rigid.

It is a third object of the present invention to provide a manufacturing method that can be automated, consistent and fast.

It is a fourth object of the present invention to provide a switch installed on the card so that the card can be more flexible in manufacturing and usage.

In order to achieve the first object, a variety of card designs are depicted and are described in detail in the detailed description of the preferred embodiment.

In order to achieve the second object, the card case is made by a plastic molding method such that the plastic is interfused with the module inside. The plastic fills the gaps and spaces that exist around and underneath the electronic components that are on the module. Moreover, the plastic bonds to the substrate and becomes a single unit thus enhancing sturdiness.

In order to achieve the third object, a new manufacturing process is disclosed. Several steps are taken in various manufacturing stages. In the assembling of the electronic components onto the substrate, the substrate is prepared so that a plurality of individual card size substrates are connected to the carrier strips. The carrier strip material is the same as the substrate material, therefore, it is convenient and efficient to make the substrate and carrier in the same process. For example, when making the substrate at the substrate plant, the PC board layout provides for a certain portion becoming card substrate and a certain portion becoming carrier, and connecting them together. Having a cutout between the neighboring card substrates permits a plurality of card substrates to be in series and connected to the carrier. In this way, plurality of substrates can be processed at the same time and conveniently handled by the various machines at the individual processing steps. For example, during the PC board assembly process, this facilitates the assembling machine of handling the substrates, and during the molding process it facilitates the molding device by having multiple cavities for molding multiple cards at the same time.

Moreover, on the substrate carrier, there are markings and punched holes. The markings will facilitate the registration of the substrate in the electrical component assembly machine. The punched holes will facilitate registration of the substrate to the molding device.

Also, in order to enhance better molding results, there are special features built inside the molding device. Inside the mold, there are columns that are located corresponding to the module second side metal contact pads locations, so that when the module is inserted inside the mold the columns coincide with metal pads and cover the metal pads and prevent them from being covered by plastic. Furthermore, there are through holes provided inside the columns which can be provided with vacuum, so that the vacuum pulls the metal pads against the columns tighter, further preventing melted plastic from covering the metal pads.

In order to achieve the fourth object, an electrical switch is installed in lieu of a plastic piece. Currently, SD cards have a plastic piece installed in the groove along a longitudinal side of the card. This plastic piece functions as a switch and lets the user have a choice to set it at one end or the other along the groove. When the card is inserted inside a card reading device, the device detects the plastic piece (i.e. switch) location, i.e. the setting, and performs the allowed function. At present, only one function has been assigned to the switch and that is "write protection", e.g. when the switch is set at the end toward the front of the card, the card is "write protected" and only "read" function can be done to the card.

According to the present invention, an electrical switch is installed on the substrate during the PC board assembling process when other electronic components are mounted to the substrate. The electrical switch is interconnected to the circuitry on the PC board, so that when the card is inserted in a card-reading device, in addition to the device detecting the physical location of the switch, the card itself will perform a certain function. For example, if the function chosen is "write protection", then an LED light is lit up on the card to inform the card user of the switch setting status. Since the switch is interconnected to the card circuit, more functions relating to the card usage can be possible, e.g. "input" or "output" of data, or "digits" of data settings for data transmission, etc.

Other novel features which are characteristic of the invention, as to organization and method of operation, together with further objects and advantages thereof will be better understood from the following description considered in connection with the accompanying drawings, in which preferred embodiments of the invention are illustrated by way of example. It is to be expressly understood, however, that the drawings are for illustration and description only and are not intended as a definition of the limits of the invention. The various features of novelty which characterize the invention are pointed out with particularity in the claims annexed to and forming part of this disclosure. The invention resides not in any one of these features taken alone, but rather in the particular combination of all of its structures for the functions specified.

There has thus been broadly outlined the more important features of the invention in order that the detailed description thereof that follows may be better understood, and in order that the present contribution to the art may be better appreciated. There are, of course, additional features of the invention that will be described hereinafter and which will form additional subject matter of the claims appended hereto. Those skilled in the art will appreciate that the conception upon which this disclosure is based readily may be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is neither intended to define the invention of this application, which is measured by the claims, nor is it intended to be limiting as to the scope of the invention in any way.

Certain terminology and derivations thereof may be used in the following description for convenience in reference only, and will not be limiting. For example, words such as "upward," "downward," "left," and "right" would refer to directions in the drawings to which reference is made unless otherwise stated. Similarly, words such as "inward" and "outward" would refer to directions toward and away from, respectively, the geometric center of a device or area and designated parts thereof. References in the singular tense include the plural, and vice versa, unless otherwise noted.

BRIEF DESCRIPTION OF THE SEVERAL VIEWS OF THE DRAWINGS

The invention will be better understood and objects other than those set forth above will become apparent when consideration is given to the following detailed description thereof. Such description makes reference to the annexed drawing wherein:

FIG. 1A is an enlarged plan view of a semiconductor card fabricated in accordance with the invention;

FIG. 1A1 is an enlarged cross sectional view of the card, taken along section line 1A1-1A1 of FIG. 1A;

FIG. 1A2 is an enlarged cross sectional view of the card, taken along section line 1A2-1A2 of FIG. 1A;

FIG. 1A3 is an enlarged cross sectional view of the card, taken along section line 1A3-1A3 of FIG. 1A;

FIG. 1A4 is an enlarged cross sectional view of the card, taken along section line 1A4-1A4 of FIG. 1A;

FIG. 1B is an enlarged plan view of the card underside;

FIG. 1C is an enlarged side elevation view of the card;

FIG. 2 is a manufacturing processing block diagram according to the present invention;

FIG. 6A is a plan view of the substrate with the switch base installed;

FIG. 6B is an enlarged cross-sectional view of the card, taken along section line 6B-6B in FIG. 6A;

FIG. 6C is a plan view and front view of the switch base;

FIG. 6D is a plan view of the switch;

FIG. 7A is a plan view of the substrate with the switch base installed;

FIG. 7B is an enlarged cross-sectional view of the card, taken along section line 7B-7B in FIG. 7A;

FIG. 7C is a plan view and front view of the switch base;

FIG. 7D is a perspective view of the switch;

FIG. 8A is a plan view of the substrate with the switch base installed;

FIG. 8B1 is an enlarged cross-sectional view of the card, taken along section line 8B-8B in FIG. 8A;

FIG. 8C is a plan view and front view of the switch base;

FIG. 8D is a front view and perspective view of the switch;

FIG. 9A is a plan view of the substrate with the switch base installed;

FIG. 9B1 is an enlarged cross-sectional view of the card, taken along section line 9B-9B in FIG. 9A;

FIG. 9C is a plan view and front view of the switch base;

FIG. 9D is a perspective view of the switch;

FIG. 10A is a plan view of the substrate with the switch base installed;

FIG. 10B is a plan view and front view of the switch;

FIG. 11A is a plan view of the substrate with the switch installed;

FIG. 11 is an enlarged cross-sectional view of the card, taken along section line 11B-11B in FIG. 11A;

FIG. 11C is a plan view and front view of the switch;

FIG. 12A1 through FIG. 12A8 are enlarged cross-sectional views of the card, taken along section line 1A1-1A1 in FIG. 1A, according to various electrical components and substrates that are inside the card;

DETAILED DESCRIPTION OF THE INVENTION

Figure 2:
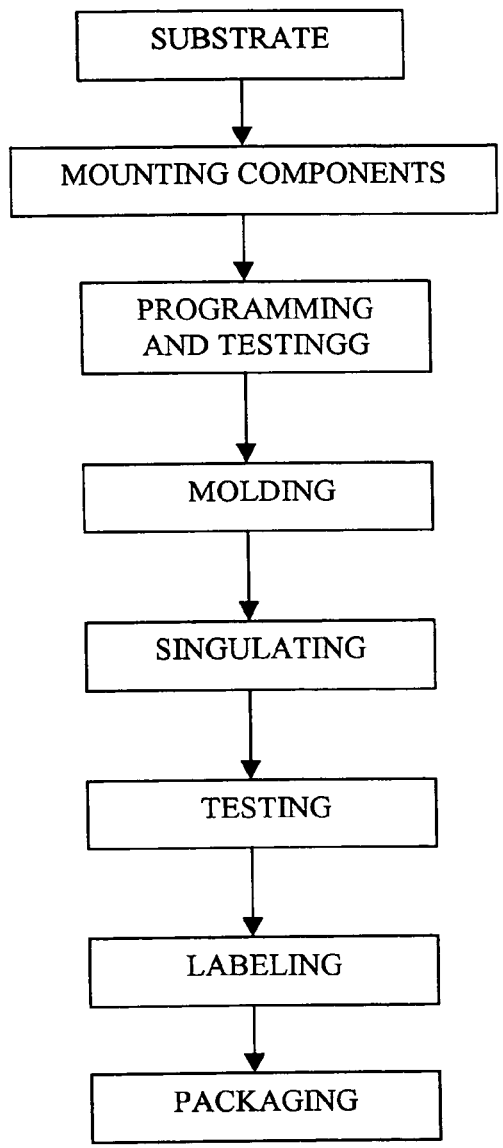

A portable integrated circuit card is constructed in accordance with the present invention. As shown in FIG. 1A, FIG. 1B and FIG. 1C, the card 10 has an outer body that is made of plastic and an inner body that is a Flash memory module. The module consists of a substrate (e.g. printed circuit board) and mounted electronic components (e.g. capacitors, resistors, integrated circuits and Flash memory, etc.).

The card is generally rectangular in shape, except in one corner has a chamfer 11. This chamfer defines the front end of the card and is to be inserted into the card-hosting device. The chamfer facilitates correct insertion of the card into the card-hosting device.

Referring to FIG. 1B, the card underneath side is shown. A plurality of openings 12 exist on the card body toward the front end and spreading in the width direction. Inside these openings are exposed contact pads 14 that reside on the substrate.

Referring to FIG. 1A1, the module inside the card is shown, containing Flash memory 15, controller 16, contact-pad 14 and opening 12.

Referring to FIG. 1A2, undercuts or recessed surfaces 17, 18 are formed on the card lower surface outer corners in the longitudinal direction. The undercuts prevent wrongful insertion of the card into the hosting-device with the card bottom face facing up inside the hosting-device.

FIG. 1A3 shows a switch 19 along one side of the card. A detailed description of the switch 19 is provided in the description of FIG. 6 through FIG. 11.

FIG. 1A4 shows the contact pads 14 and the ribs 13 on the card. The ribs exist between the contact pads and prevent fingers from contacting the contact pads.

Referring to FIG. 2, a block diagram of the card manufacturing procedure is depicted. The first step involves the substrate manufacturing, followed by mounting of the components, programming and testing, molding, singulating, testing labeling, and packaging.

Figure 3A:
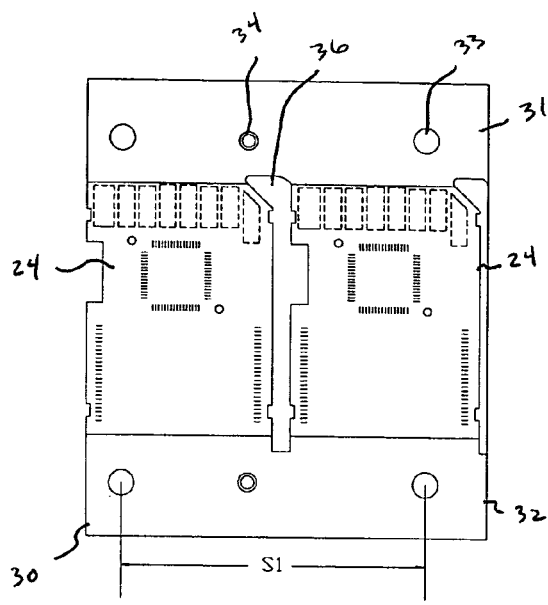
FIG. 3A is an enlarged plan view of the substrate strip containing plurality of PC boards.

Referring to FIG. 3A, a substrate 24 is depicted. The substrate 24 material can be made from bismalemide-triazine, epoxy resins, and polyamide resins. The substrate can compose a multiple of layers; the quantity of layers and total thickness of substrate depends on the design. For example, the illustrated substrate in the present invention has a thickness of 0.3 mm.

The substrate 24 is part of a strip 30 that contains plurality of individual substrates 24 connected by carriers 31 and 32. The substrate 24 shape is generally similar to the card shape but slightly smaller and has a plurality of jagged edges (not shown) along the outer peripheral edges. In the molding process, the slightly smaller substrate gives space for the molded plastic covering the substrate outer periphery to form the card outer edges and meeting card size specifications, and the jagged edges enhance plastic adhering to substrate. Also, on the substrate 24 in the contact pad area, there exists a plurality of through-holes (not shown) between contact pads. The holes allow the plastic to fill the holes and form posts inside and enhance the plastic adhering to the substrate.

The strip 30 includes the carrier 31, the carrier 32, the cutout 36 and individual substrate 24 (i.e. PC board). The carrier includes hole 33 and markings 34, such that the markings 34 facilitate locating the substrate correctly in the assembly-machine, and the holes 33 facilitate locating the substrate correctly in the molding device.

Figure 3B:
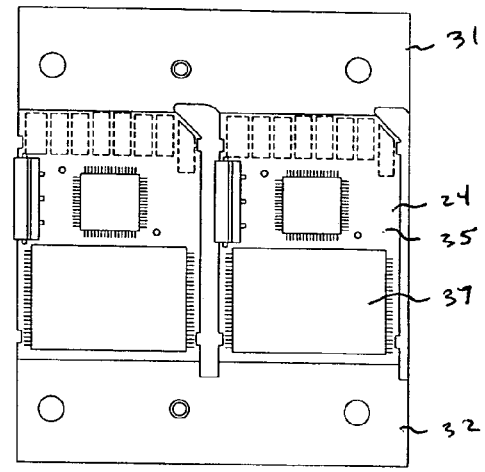
FIG. 3B is an enlarged plan view of the substrate strip containing plurality of assembled modules.
Figure 3C:
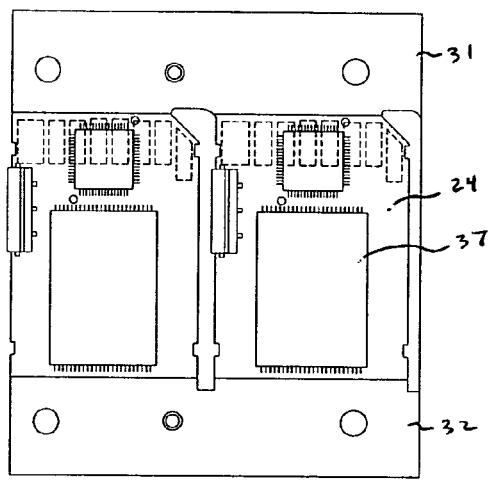
FIG. 3C is an enlarged plan view of the substrate strip according to an alternative substrate layout of the present invention.

FIG. 3C shows another substrate layout, in that the Flash Memory 37 is turned 90 degrees, such that the Flash Memory body longitudinal direction is parallel to the substrate longitudinal direction. Because the Flash Memory's body is adding to the strength of the card, the card is more rigid.

Figure 3D:
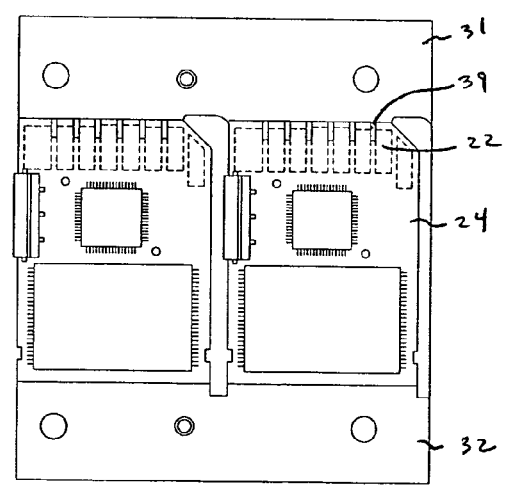
FIG. 3D is an enlarged plan view of the substrate strip according to an another alternative substrate layout of the present invention.

Referring to FIG. 3D, another substrate layout is shown. The substrate 24 has a plurality of slots 39 between the contact pads 22. In the card molding process, there will be plastic ribs formed from the molding device between the contact pads, and the ribs connect to the card's other side plastic surface through the slots, and hence the ribs are sturdier.

Referring to FIG. 2, the next step is mounting the components to the substrate. The substrate strip is inserted into a solder dispensing machine (not shown). The solder paste is dispensed on the substrate by a machine (not shown). Next, the substrate strip is inserted into an assembly machine (not shown) for installing the electrical component on to the substrate. The marking 34 (FIG. 3A) on carriers 31 and 32 facilitates indexing of the substrate strip into the designated location in the machine.

Next, the electrical components are mounted to the substrate by an assembly machine (not shown). The electrical components can be a capacitor, resistor, integrated circuits, semiconductor, etc.

Next, the assembled substrate is sent through an oven (not shown) and the components are soldered to the substrate and become a module 35, as shown in FIG. 3B.

Next, a programming and testing procedure for the module can be performed.

Figure 4A:
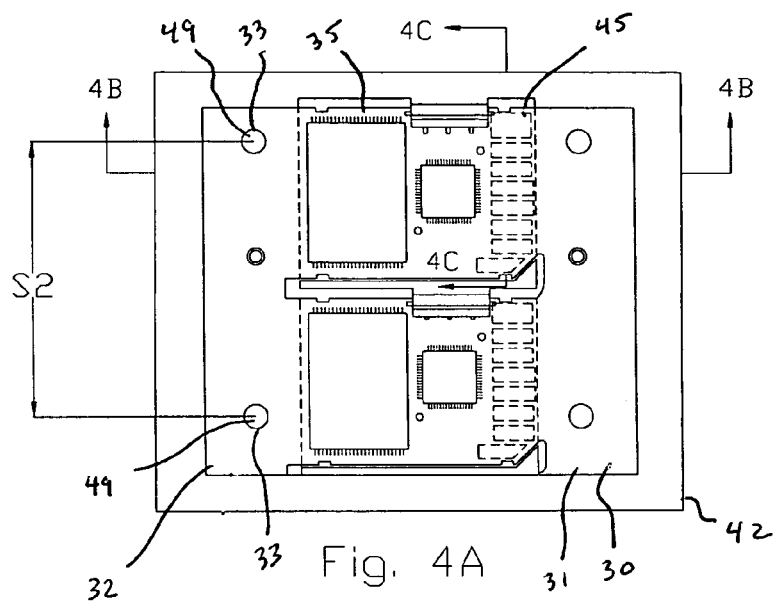
FIG. 4A is a plan view of the molding device lower-mold with the module inserted inside.
Figure 4B:
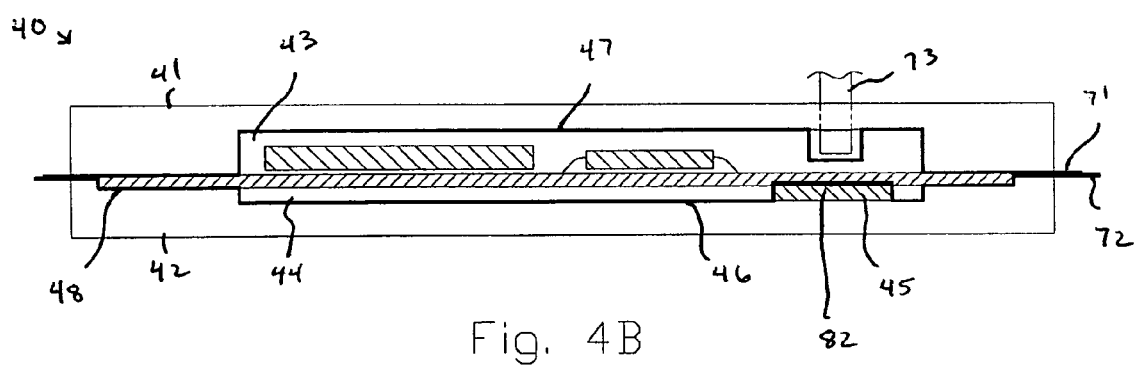
FIG. 4B is a cross-sectional view taken along line 4B-4B in FIG. 4A.

Referring to FIG. 4A and FIG. 4B, the module is then sent to a molding device 40 which consists of an upper platen 41 and a lower platen 42. Upper platen 41 contains cavity 43 with upper surface 47.

Lower platen 42 contains cavity 44. Cavity 44 has surface 46, and surface 48. On surface 48, a plurality of pins 49 protrude upward. The spacing "S2" between pins 49 is the same as "S1" (FIG. 3A) between holes 33 on substrate carrier 31 and 32.

In lower cavity 42, a plurality of rectangular shaped blocks 45 protrude upward from surface 46, located corresponding to the contact pad 22 location when the module is inserted in the platen.

When the module 35 is inserted in the lower platen, carrier 31 and carrier 32 rest on surface 48, and holes 33 on the carrier 31,32 align with pins 49. The alignment of pins and holes enable strip 30 and module 35 to be positioned correctly and consistently inside the platen.

U.S. Pat. No. 5,891,483 discloses a machine for applying "release film" in the molding process in order to reduce the "flash", a plastic ridge usually formed around the gaps between the moving components, such as ejector pins, and the mold platen. The molding process of using "release film" is preferably utilized in the present invention.

Figure 4C:
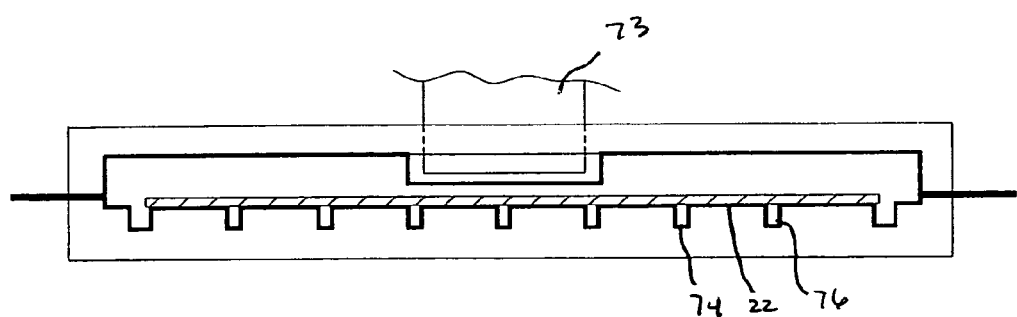
FIG. 4C is a cross-sectional view of the molding device, taken along line 4C-4C in FIG. 4A.

Referring to FIGS. 4B and 4C, on the molding device upper platen, a plastic film 71 (i.e. release film) is applied between the upper platen lower surface and the module. On the lower platen, a plastic film 72 is applied between the module bottom surface and platen upper surface 46, so that when the upper platen and lower platen clamp together, upper film 71 exists above the module, and lower film 72 exists below the module.

From the upper platen, a plurality of spring loaded retractable rods 73 having a dull end in extended position pushes the upper film 71 against the top of the module on the contact pad area. Because the rods are spring loaded, when it is against the film and module, the pressure is firm but does not puncture the plastic film, and the rods adapt to the height profile of the module. Thus the rods firmly press the contact pads 22, pinching the lower film 72 against the columns 45, so that the film forms seals around the contact pads and prevents the molten plastic from moving onto the contact pad surfaces. Therefore, when the pressurized molten plastic flows into the mold cavity, between the upper film and the lower film, the plastic fills the grooves 74 forming ribs 76 but does not cover the contact pads 22; thus the contact pads are clean. After the plastic fills the majority of the cavity, the rods 73 retract, and since the module is supported by the carriers and not moving, the plastic fills the rest of the cavity and completely covers the module. Because of the presence of the plastic film, there is no flash on the surfaces of the molded card, and the molded part does not stick to the mold, so it is easier to remove the molded card from the mold, especially in the delicate rib area, and not damage the ribs. In the illustration described above, the lower film is required for keeping the contact pads clean, but the upper film which eliminates the flash from around the retractable pins is not mandatory.

The inventive method thus preferably uses release film in the molding process. By using the release film in the lower platen 42, the up protruding block 45 top surfaces are covered by the film. When vacuum is activated through the holes 82 inside blocks 45, the vacuum activates a pulling force onto the film and since on top of the film are the contact pads 22, the vacuum pulls the contact pads against the blocks 45 and squeezes the release film. As the release film is resilient, the squeezed film is deformed and becomes a seal preventing melted plastic flowing onto the contact pads. In addition, the release film reduces Flash on the molded parts where inject pins and other moving components are inside the molding cavity and making contact with the melted plastic resin.

After a cooling down period, the molded card is taken out of the mold and is connected by carrier 31 and carrier 32.

Next, a separating step separates the card from carrier 31 and carrier 32. This is performed by utilizing cutters (not shown) which sever through the connecting part between the molded card and carrier 31 and carrier 32. After cutting, the individual card 10 is shown in FIG. 1A, FIG. 1B and FIG. 1C.

Figure 5:
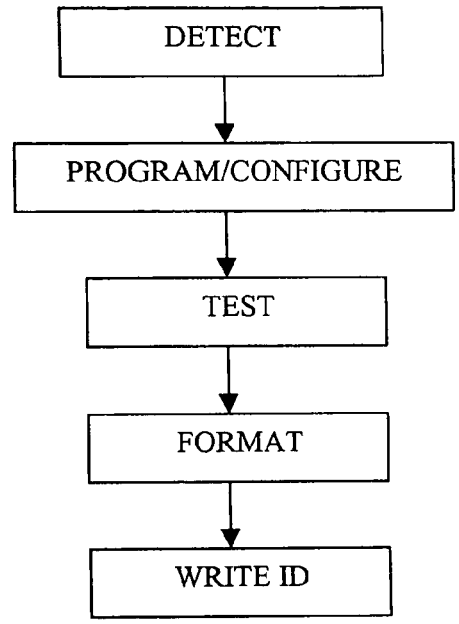
FIG. 5 is a programming and testing block diagram according to the present invention.

Next, the card is sent through the programming and testing procedure (see FIG. 5). The general Flash Card test flow chart may include the following:

1. Run the test program on the host (host may be an IBM compatible personal computer or equivalent).

2. Initialize: Input some basic test information manually from keyboard or load an initial setting file.

3. Plug in Flash Card to the host: Host may have a build-in card reader, or use a card reader with a USB or PCMCIA interface. For a production test, the testing program can allow more than one Flash Card plug in at a time.

4. Detect Flash Card connection: Test program will detect the plug-in Flash Cards and check if they are the correct types. If a Flash Card is not detected, mark it as defective, then replace with another DUT.

5. Program card with initial configuration: Testing program will do the low-level format first, then create the card information table and ID table based on the initial setting. Different tables will be created depending on the card type. If the low-level format is not successful, mark it as defective.

6. Format the card to designate file system: Testing program will create partition table and do the formatting. If format fails, mark it as defective. If format is successful check the capacity to see if it is match or not. If capacity is not matched, display the correct one and mark it as defective.

7. Go over tests to check all functionality: Testing program will physically write and read back to compare testing on Flash chips. If testing fails, mark it as defective.

8. Program card with final serial number: Program Flash Card serial number and counter plus one.

9. Check Media Empty: Check whether Flash Card is empty or not. If it is not empty, mark it as defective.

10. Check Flash Card information table and ID table.

Regarding the switch that is installed on the side of the card, there are six embodiments of the present invention.

Referring to FIG. 6A-6D, the $1^{st}$ embodiment of the switch of the present invention is shown, regarding the "write" protection switch.

In FIG. 6A, the card substrate 61 first surface has soldering-pads 63, such that a switch base 65 shown in FIG. 6C is installed and soldered to the substrate. The switch base has soldering legs, so that switch base 65 can be placed onto the substrate at the same time as the electronic components are installed onto the substrate by an assembly machine and soldered to the soldering pads. The switch in all the other embodiments similarly have soldering legs and can be installed by the assembly machine.

FIG. 6B shows a cross section of the switch area where insert 66 (shown in FIG. 6D) is installed in the slot 67 existing on the switch base 65. Insert 66 is made of a resilient material and is slightly bigger than slot 67, so that insert 66 fits tightly inside slot 67 and will not move by itself.

Referring to FIG. 7A-7D, a $2^{nd}$ embodiment of the present invention regarding the switch is shown.

In FIG. 7A, the card substrate 71 first surface has soldering-pads 73, such that a switch base 75 shown in FIG. 7C is installed and soldered to the substrate.

FIG. 7B shows a cross section of the switch area where the assembled switch including the insert 76 shown in FIG. 7D is installed in the slot 77 existing on the switch base 75 with the insert 76 in its outward position. Insert 76 is made of a resilient material and slightly bigger than slot 77, so that insert 76 fits tightly inside slot 77 and will not move by itself.

Referring to FIG. 8A-8D, a $3^{rd}$ embodiment of the present invention regarding the switch is shown.

In FIG. 8A, the card substrate 81 first surface has soldering-pads 83, such that a switch base 85 shown in FIG. 8C is installed and soldered to the substrate.

FIG. 8B shows a cross section of the switch area where the insert 86 shown in FIG. 8D is installed in the guide 87 existing on the switch base 85. Insert 86 is made from a resilient material, and the existing slot 88 is slightly smaller than guide 87, so that insert 86 fits tightly on guide 87 and will not move by itself.

Referring to FIG. 9A-9D, a $4^{th}$ embodiment of the present invention regarding the switch is shown.

In FIG. 9A, the card substrate 91 first surface has soldering-pads 93, such that a switch base 95 shown in FIG. 9C is installed and soldered to the substrate.

FIG. 9B, shows a cross section in the switch area where the assembled switch including the insert 96 shown in FIG. 9D is installed in the guide 97 existing on the switch base 95 with the insert 96 in its outward position. Insert 96 is made from a resilient material, and the existing slot 98 is slightly smaller than guide 97, so that insert 96 fits tightly on guide 97 and will not move by itself.

Referring to FIG. 10A-10B, a $5^{th}$ embodiment of the present invention regarding the switch is shown.

In FIG. 10A, the card substrate 101 first surface has soldering-pads 103, such that an electrical switch 105 shown in FIG. 10B is installed and soldered to the substrate, and is electrically connected to the substrate circuitry. The electrical switch 105 has knob 106, has two positions, and is at its forward position shown in FIG. 10A.

Since the switch is electrically connected to the substrate circuitry, if the switch is set at "write protect" position, besides the card hosting device detecting the switch physical setting and limiting the "write" function toward the card, the card can display certain messages (e.g. a red "LED" is lit on the card) informing the user of the switch setting.

Referring to FIG. 11A-11C, a $6^{th}$ embodiment of the present invention regarding the switch is shown.

In FIG. 11A, the card substrate 111 first surface has soldering-pads 113, such that an electrical switch 115 shown in FIG. 11C is installed and soldered to the substrate, and is electrically connected to the substrate circuitry. The electrical switch 115 has knob 116, has two positions, and is at its outward position shown in FIG. 11A and FIG. 11B.

Since the switch is electrically connected to the substrate circuitry, if the switch is set at "write protect" position, besides the card hosting device detecting the switch physical setting and limiting the "write" function toward the card, the card can display certain messages (e.g. a red "LED" is lit on the card) informing the user of the switch setting.

Referring now to FIG. 12A1 through FIG. 12A8, these views illustrate a variety of designs of the card by arrangement of the installed location of the Flash memory, and/or by utilizing both surfaces of the substrate and/or by stacking one Flash memory on top of the other, such that many new designs and structures are available. The Flash memory that is available for installing on the card is manufactured by Samsung and other manufacturers, and the semiconductor chip packages and Dies contained within are as follows: In TSOP (Thin Small Outline Packages) packages or in WSOP (Very Very Thin Small Outline Packages) packages; "K9F series"—Single Die with Single Chip Select—WSOP or TSOP; "K9F series"—Dual Die with Single Chip Select—WSOP or TSOP; and "K9W series"—Quart Die stacked with Dual Chip Select—TSOP.

The following is a detailed description of each individual design of the card. In each card design, the switch described in FIG. 6 through FIG. 11 can be installed onto the substrate by a SMT machine or a Through Hole machine, etc., at the same time and process that the other electronic components are installed.

Referring to FIG. 12A1, a card 1210 is constructed according to another embodiment of the present invention. A WSOP 1211 and a Controller 1215 are installed on the substrate 1212. As shown, the card is 2.1 mm thick, the WSOP 1211 is 0.7 mm thick, the substrate 1212 is 0.3 mm thick and the card shell thickness above the WSOP is 0.4 mm and below is 0.7 mm. Underneath the contact pad 1213 of the card there are the openings 1214 on the card, and the depth of the openings is 0.7 mm.

Referring to FIG. 12A2, a card 1220 is constructed according to another embodiment of the present invention.

Two WSOPs 1221 and a Controller 1225 are installed on the substrate 1222, with one WSOP on top of the substrate, and the other below the substrate. The memory capacity is increased two-fold with the additional WSOP. As shown, the card is 2.1 mm thick, the WSOP 1221 is 0.7 mm thick, the substrate 1222 is 0.3 mm thick and the card shell thickness above the WSOP is 0.2 mm and below is 0.2 mm. Underneath the contact pad 1223 of the card there are the openings 1224 on the card, and the depth of the openings is 0.7 mm. The substrate is inclined downward toward the front end of the card. The slope is 0.2 mm over the length of the card.

Referring to FIG. 12A3, a card 1230 is constructed according to another embodiment of the present invention. A TSOP 1231 and a Controller 1235 are installed on the substrate 1232. As shown, the card is 2.1 mm thick, the TSOP 1231 is 1.1 mm thick, the substrate 1232 is 0.3 mm thick and the card shell thickness above the TSOP is 0.5 mm and below is 0.2 mm. Underneath the contact pad 1233 of the card there are the openings 1234 on the card, and the depth of the openings is 0.7 mm. The substrate is inclined upward toward the front end of the card. The slope is 0.5 mm over the length of the card. The slope of the substrate provides more room above the substrate for installing a thicker memory component.

Referring to FIG. 12A4, a card 1240 is constructed according to another embodiment of the present invention. Two Flash Memory DIEs 1241 and a Controller 1245 are installed on the substrate 1242. As shown, the card is 2.1 mm thick, the DIE 1241 is 0.5 mm thick, the substrate 1242 is 0.3 mm thick and the card shell thickness above the DIE is 0.5 mm and below is 0.2 mm. Underneath the contact pad 1243 of the card there are the openings 1244 on the card, and the depth of the openings is 0.7 mm. The substrate is inclined upward toward the front end of the card. The slope is 0.5 mm over the length of the card. The inclination gives more room above the substrate, so that two of the DIE components can be installed.

Referring to FIG. 12A5, a card 1250 is constructed according to another embodiment of the present invention. A TSOP 1251 and a Controller 1255 are installed on the substrate 1252. The card has plastic body on the upper surface and the underneath side is exposed substrate. A connector 1256 has a ledge 1257 installed to the substrate at the ledge.

As shown, the card is 2.1 mm thick, the TSOP 1251 is 1.1 mm thick; the substrate 1252 is 0.3 mm thick. The card shell thickness above the TSOP is 0.7 mm. On the connector and underneath the contact pad 1253 are the openings 1254, and the depth of the openings is 0.7 mm.

Referring to FIG. 12A6, a card 1260 is constructed according to another embodiment of the present invention. A TSOP 1261 and a Controller 1265 are installed on the substrate 1262. The card has plastic body on the upper surface and the underneath side is exposed substrate. The substrate 1262 is thicker than the regular substrate. A connector 1266 has a ledge 1267 which is installed to the substrate at the ledge.

As shown, the card is 2.1 mm thick, the TSOP 1261 is 1.1 mm thick; the substrate 1262 is 0.7 mm thick. The card shell thickness above the TSOP 1261 is 0.4 mm thick. On the connector and underneath the contact pad 1263 are the openings 1264, and the depth of the openings is 0.7 mm.

Referring to FIG. 12A7, a card 1270 is constructed according to another embodiment of the present invention. A TSOP 1271 and a Controller 1275 are installed on the substrate 1272. The card has plastic body on the upper surface and the underneath side is exposed substrate, except on the rearward end of the card an edge 1278 exists along the width of the card. The substrate 1272 contains a connector 1276 and is joined at joint 1277. The connector 1276 has flexible contacts 1278 and slot 1279 and is connected to the substrate by substrate inserted in slot 1279.

As shown, the card is 2.1 mm thick, the TSOP 1271 is 1.1 mm thick, the substrate 1272 is 0.3 mm thick and the card shell thickness above the TSOP is 0.3 mm. Underneath the contact pad 1273 of the card there are the openings 1274 on the connector, and the depth of the openings is 0.7 mm.

Referring to FIG. 12A8, a card 1280 is constructed according to another embodiment of the present invention. Two of the DIE 1281 and a Controller 1285 are installed on the substrate 1282. The card has plastic body on the upper surface and the underneath side is exposed substrate. The substrate 1282 bends at a location just rearward of the contact pads. The card only has plastic coverage on the upper surface, and the substrate lower surface is not covered except at the contact pad area where plastic ribs are formed between the contact pads. The memory capacity is doubled with the additional DIE.

The techniques of semiconductor stacking are disclosed in U.S. Pat. No. 6,542,393.

As shown, the card is 2.1 mm thick, the DIE 1281 is 0.5 mm thick, the substrate 1282 is 0.3 mm thick and the card shell thickness above the DIE is 0.8 mm. Underneath the contact pad 1283 are the openings 1284, and the depth of the openings is 0.7 mm.

In the illustrations described above, in FIG. 12A1 through FIG. 12A8, any semiconductor packages thickness which is equivalent or less than the illustrated component thickness can take the place of illustrated packages and can be mounted to the substrate. For example, a Flash BGA package usually is 1.0 mm thick can be mounted to the substrate in lieu of TSOP, and a Flash memory Die package usually is 0.5 mm thick can be mounted in lieu of WSOP.

FIG. 13 through FIG. 18 illustrate a variety of designs of the inventive card involving the contact pads and card sizes.

Figure 13:
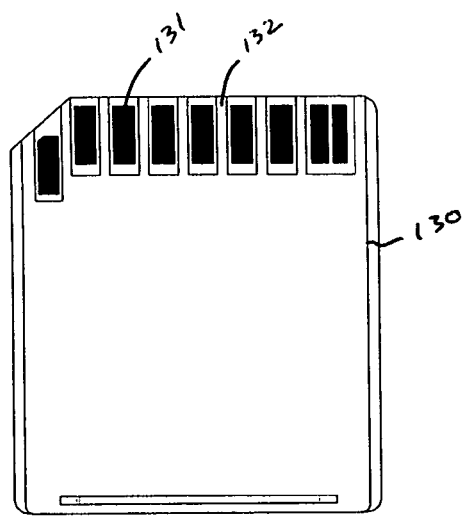
FIGS. 13-18 illustrate different SD cards with different contact pad arrangements according to this invention.

Referring to FIG. 13, a card 130 is constructed according to another embodiment of the present invention. The nine contact pads 131 form a single row with plastic ribs 132 existing between the contact pads. The nine contact pads enable the card transmits data in "4 bit" set up. The card does not have a notch and a switch along the side of the card as the other illustrated cards do.

Figure 14:
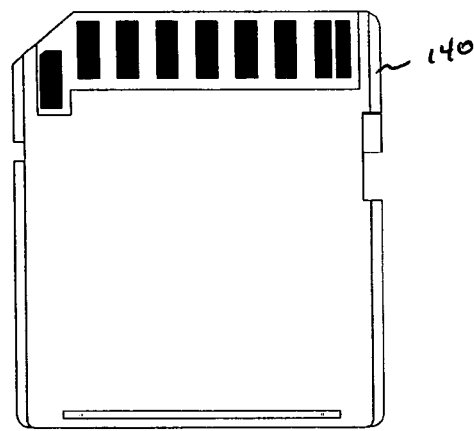

Referring to FIG. 14, a card 140 is constructed according to another embodiment of the present invention. The nine contact pads form a single row, but there is no plastic rib existing between the contact pads. The nine contact pad enables the card to transmit data in "4 bit" set up.

Figure 15:
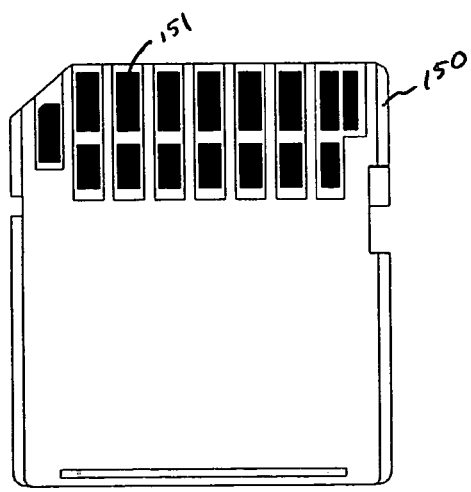

Referring to FIG. 15, a card 150 is constructed according to another embodiment of the present invention. Card 150 has 16 contact metal pads 151 aligned into 2 rows with plastic ribs existing in between the contact pads. The evolving applications for this type of memory card have made it necessary to add several external contacts for better data transmission without increasing the size of the card, so the card is developed to have 16 contact metal pads. The location and construction of the pads allow the card to remain compatible with the SD card standard while providing additional contacts. The 16 metal pads allowing the card to communicate with the host device in "8 bit" set up for I/O transmission, although 13 pads is enough for "8 bit" set up. The read and write data transfer rate is up to 2 times faster than the "4 bit" set up.

Figure 16:
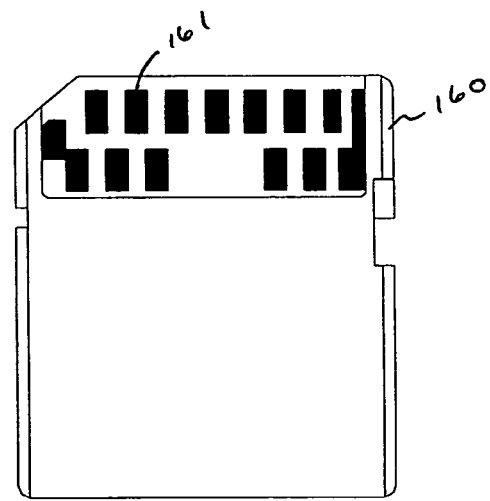

Referring to FIG. 16, a card 160 is constructed according to another embodiment of the present invention. It has 13 contact metal pads 161 formed into 2 rows without plastic ribs between the contact pads, and the contact pads in the $2^{nd}$ row do not align with the $1^{st}$ row. The location and construction of the pads allow the card to remain compatible with the SD card standard while providing additional contacts. The 13 metal pads allow the card to communicate with the host device in "8 bit" set up for I/O transmission.

Figure 17:
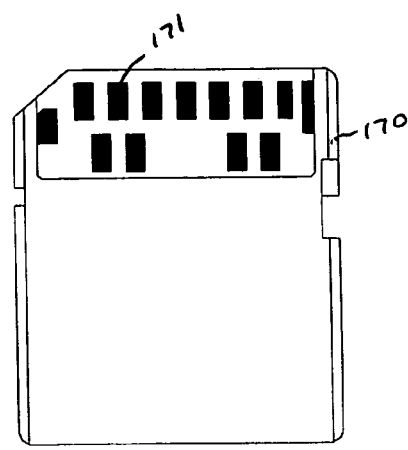

Referring to FIG. 17, a card 170 is constructed according to another embodiment of the present invention. The card is shorter than the regular card because some devices have limited space such that a shorter card is needed. The card has 13 contact pads 171 formed into 2 rows, such that the plastic ribs between the contact pads exist on the $2^{nd}$ row but do not exist on the $1^{st}$ row, also the contact pads on $2^{nd}$ row do not align with that on the $1^{st}$ row. The location and construction of the pads allow the card to remain compatible with the SD card standard while providing additional contacts. The 13 metal pads allow the card to communicate with the host device in "8 bit" set up for I/O transmission.

Figure 18:
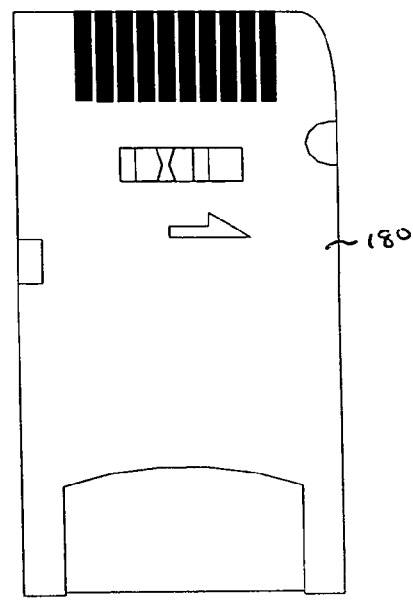

Referring to FIG. 18, showing a Memory Stick card 180, which structure is similar to an SD card, which has a plastic body and has a Flash Memory module therein. It has 10 contact pads in the front end and has a rounded chamfered corner at the leading edge. The manufacturing procedures described herein for the SD card can be applied to the manufacture of the Memory Stick card.

Figure 19A:
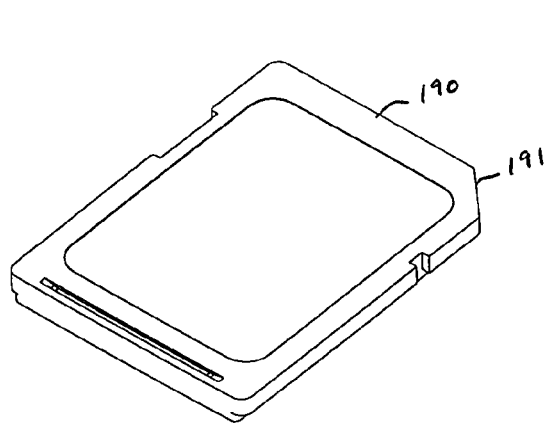
FIGS. 19A-19C illustrate a conventional (prior art) SD card shell and memory module.
Figure 19B:
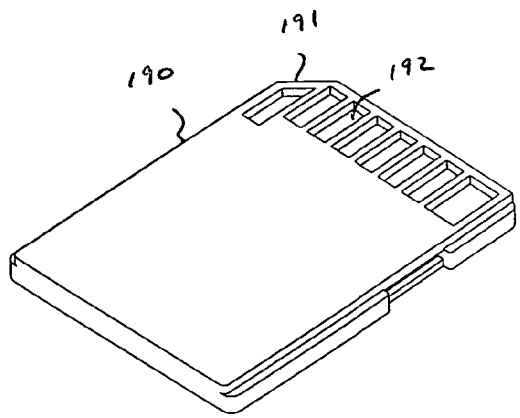
Figure 19C:
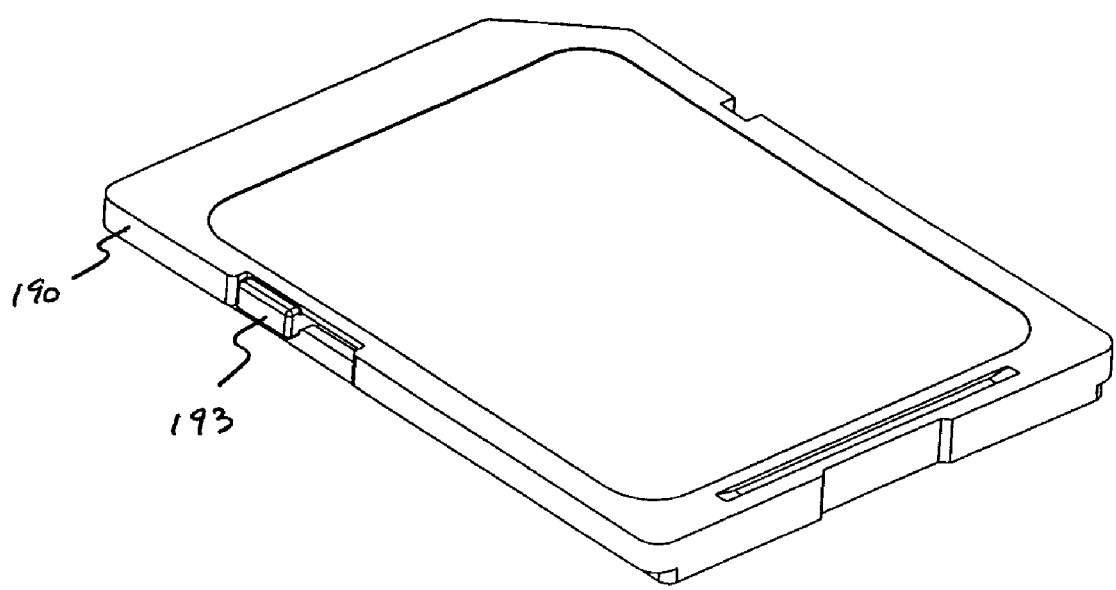

Referring to FIG. 19A-19C (Prior Art), the standard SD card 190 is 24 mm wide, 32 mm long, and 2.1 mm thick. The card is generally rectangular in shape, except one corner has a chamfer 191. This chamfer 191 defines the front end of the card and is to be inserted first into the card-hosting device. The chamfer facilitates correct seating of the card when the card is inserting in the card-interfacing device. Also on the underneath side exists plurality of contact pads 192 that can transmit electrical signals with the card-hosting device. There are also two longitudinal undercuts exiting on the outer lower corners on the underneath side of the card to prevent the card from being inserted into the hosting device with the card underneath side facing upward.

Referring to FIG. 19C, there is a write protection switch 193 on the side of the card. The switch provides write protection from the card-hosting device. The switch has at least two positions; a position for allowing the host to read and write normally and another position for write protection. When the switch is in the write protection position, the host can read data from the card but can not write or erase data. At present, the switch 193 is a plastic piece that is inserted inside the groove on the side of the card and can slide in the groove. The switch 193 does not make any contact with the electrical circuit on the card.

The above disclosure is sufficient to enable one of ordinary skill in the art to practice the invention, and provides the best mode of practicing the invention presently contemplated by the inventor. While there is provided herein a full and complete disclosure of the preferred embodiments of this invention, it is not desired to limit the invention to the exact construction, dimensional relationships, and operation shown and described. Various modifications, alternative constructions, changes and equivalents will readily occur to those skilled in the art and may be employed, as suitable, without departing from the true spirit and scope of the invention. Such changes might involve alternative materials, components, structural arrangements, sizes, shapes, forms, functions, operational features or the like.

Therefore, the above description and illustrations should not be construed as limiting the scope of the invention, which is defined by the appended claims.

What is claimed as invention is:

1. A method for fabricating a semiconductor card, said method comprising the steps of:
   preparing a substrate;
   mounting electrical components to the substrate to form a module by providing the substrate with soldering pads, providing a switch base with soldering legs, and soldering the switch base legs to the substrate soldering pads;
   preparing a molding device; and
   molding the card body over the substrate and electrical components.

2. The method for fabricating a semiconductor card of claim 1 further including the step of testing the electrical components before the step of molding the card body.

3. The method for fabricating a semiconductor card of claim 1 wherein the step of preparing the substrate includes preparing a plurality of individual card size substrates.

4. The method for fabricating a semiconductor card of claim 1 wherein the step of preparing the substrate includes preparing a plurality of individual card size substrates connected to carrier strips.

5. The method for fabricating a semiconductor card of claim 4 wherein the step of preparing the substrate includes making the substrate and carrier strips from the same material.

6. The method for fabricating a semiconductor card of claim 4 wherein the step of preparing the substrate includes providing a cutout between neighboring card substrates.

7. The method for fabricating a semiconductor card of claim 4 wherein the step of preparing the substrate includes providing markings on the carrier to facilitate registration.

8. The method for fabricating a semiconductor card of claim 4 wherein the step of preparing the substrate includes providing holes on the carrier to facilitate registration.

9. The method for fabricating a semiconductor card of claim 1 wherein the step of preparing the molding device includes providing colunms corresponding to the semiconductor card contact pad locations, so that when the module is inserted inside the mold the columns coincide with metal pads and cover the metal pads and prevent them from being covered by plastic.

10. The method for fabricating a semiconductor card of claim 9 wherein the step of preparing the molding device includes providing holes in the columns for connection to a vacuum, so that the vacuum pulls the pads against the columns, further preventing melted plastic from covering the pads.

11. The method for fabricating a semiconductor card of claim 1 wherein the step of preparing the substrate includes providing a substrate having a shape generally similar to the card shape but smaller to permit encapsulation during the molding process.

12. The method for fabricating a semiconductor card of claim 1 wherein the step of preparing the substrate includes providing slots between the contact pads so that ribs are formed between the pads during the molding process.

13. The method for fabricating a semiconductor card of claim 1 wherein the step of preparing the molding device before the step of molding the card body includes applying a release film.

14. The method for fabricating a semiconductor card of claim 1 including the step of installing a switch on the switch base.

15. The method for fabricating a semiconductor card of claim 1 wherein the step of installing a switch on the switch base comprises installing an insert into a slot on the switch base.

16. The method for fabricating a semiconductor card of claim 1 wherein the insert is made of a resilient material and is larger than the slot on the switch base, to effect a tight fit.

17. The method for fabricating a semiconductor card of claim 1 wherein the switch is electrically connected to the substrate circuitry.

18. The method for fabricating a semiconductor card of claim 1 wherein the switch has at least two positions.

* * * * *